(12) United States Patent
Hiraga et al.

(10) Patent No.: US 7,511,894 B2
(45) Date of Patent: Mar. 31, 2009

(54) OPTICAL FLIP-FLOP CIRCUIT

(75) Inventors: Takashi Hiraga, Osaka (JP); Nobutaka Tanigaki, Osaka (JP); Noritaka Yamamoto, Osaka (JP); Toshiko Mizokuro, Osaka (JP); Ichiro Ueno, Osaka (JP); Norio Tanaka, Tokyo (JP); Hiroshi Nagaeda, Hokkaido (JP); Noriyasu Shiga, Hokkaido (JP)

(73) Assignees: Dainichiseika Color & Chemicals Mfg. Co., Ltd., Tokyo (JP); National Institute of Advanced Industrial Science and Technology, Tokyo (JP)

( * ) Notice: Subject to any disclaimer, the term of this patent is extended or adjusted under 35 U.S.C. 154(b) by 162 days.

(21) Appl. No.: 11/704,221

(22) Filed: Feb. 9, 2007

(65) Prior Publication Data
US 2007/0263426 A1 Nov. 15, 2007

(30) Foreign Application Priority Data
Feb. 10, 2006 (JP) ............................. 2006-033568

(51) Int. Cl.
*G02B 13/00* (2006.01)
*H03K 3/00* (2006.01)
(52) U.S. Cl. ................... 359/722; 327/199; 327/295; 326/46; 365/154

(58) Field of Classification Search ................. 359/722; 307/406; 326/46; 327/199, 295, 332
See application file for complete search history.

(56) References Cited

U.S. PATENT DOCUMENTS

| 5,497,114 A * | 3/1996 | Shimozono et al. ......... 327/202 |
| 2003/0067322 A1 * | 4/2003 | Stan et al. ....................... 326/46 |
| 2007/0146030 A1 * | 6/2007 | Hoss et al. .................... 327/218 |

\* cited by examiner

*Primary Examiner*—Jordon M. Schwartz
(74) *Attorney, Agent, or Firm*—Wenderoth, Lind & Ponack, L.L.P.

(57) ABSTRACT

A flip-flop circuit of the present invention includes a first switch and a second switch which are connected in series to each other. The first switch includes: two input ports upon which light source light and signal light are incident; two output ports for outputting an optical output; and a thermal lens forming element for forming a thermal lens in a predetermined optical inputting condition. Although the second switch is composed in the same manner as that of the first switch, a relation between the wave-lengths to be utilized is inverted. When a state is changed from OFF to ON, a pulse signal is inputted for setting and one of the rays of output light of the second switch is fed-back to the first switch so as to maintain the state of ON. When the state is changed from ON to OFF, a pulse of additional signal light is inputted. Due to the foregoing, the two states of ON and OFF can be stably maintained.

2 Claims, 3 Drawing Sheets

OPTICAL FLIP-FLOP CIRCUIT

BACKGROUND OF THE INVENTION

1. Field of the Invention

The present invention relates to an optical flip-flop circuit operated on the basis of a new operation principle.

2. Description of Related Art

The flip-flop circuit is an electronic circuit having two stable states of "ON" and "OFF" or "HIGH" and "LOW". That is, the flip-flop circuit is a basic electronic circuit element in which when these two stable states are made to correspond to "0" and "1", information of 1 bit can be held, and in addition to that, the two states can be alternately changed.

According to rapid progress of the optical communication technique and the optical information processing technique that has been recently made, in the field of optical technique, investigations and developments of an optical flip-flop circuit corresponding to a conventional flip-flop circuit, which is a basic electronic circuit, have been made. Therefore, some proposals relating to the optical flip-flop circuit have been made.

For example, JP-A-6-95194 discloses the following technique. An oversaturation absorbing region of a bistable laser, the substrate polarity of which is "n", and an oversaturation absorbing region of a bistable laser, the substrate polarity of which is "p", are connected to each other through a bias. When one of the bistable lasers makes oscillation, the other of the bistable lasers stops oscillation. In this way, the optical flip-flop circuit operates as an optical inverter circuit.

JP-A-4-130316 discloses the following technique. All elements are monolithically accumulated on the same substrate by using a semiconductor optical modulation circuit. In this way, a highly reliable optical flip-flop circuit is proposed which is operated at high speed by low voltage without causing deviation of an optical axis.

Further, JP-A-2-190019 discloses the following optical flip-flop circuit. The optical flip-flop circuit includes: a light receiving element; a light emitting element; a conductive passage for guiding an electric signal to the light emitting element; a light guiding passage for guiding an optical signal to the light receiving element; and an optical input and output portion which gives an optical input signal to the light receiving element and which guides an optical output signal outputted from the light emitting element, wherein all control signals and input and output signals can be processed by light.

However, structures of the optical flip-flop circuits, which have been conventionally proposed, are complicated and the costs of manufacturing the optical flip-flop circuits are necessarily raised. In the fields of optical communication and optical information, which will make rapid progress in future, it is desired to realize an optical flip-flop device, the structure of which is simple and the manufacturing cost of which is low.

The present invention has been accomplished in view of the above circumstances. It is an object of the present invention to provide an optical flip-flop circuit based on a new operation principle, the structure of which is simple and the manufacturing cost of which is low.

SUMMARY OF THE INVENTION

The present invention has been achieved to accomplish the above task. The present invention provides an optical flip-flop circuit comprising: a first optical switch, a second optical switch and a feedback portion; the first optical switch comprising, a first signal input portion upon which a ray of first signal light, the shape of which is pulse-shaped, having a first wave-length $\lambda 1$, and a ray of first light source light, which is continuous light, having a second wave-length $\lambda 2$, are incident being concentrically converged; a first thermal lens forming element in which a thermal lens is used, the thermal lens having a first light absorbing layer having a wave-length band exhibiting an absorbing property with respect to the first signal light and also exhibiting a transmission property with respect to the first light source light, the thermal lens being based on a distribution of an index of refraction reversibly generated by a temperature rise in a region of the first light absorbing layer which absorbs the first signal light and by a temperature rise in its peripheral region, the first thermal lens forming element realizing a state, in which the light source light is emergent by a usual open angle in the case where the first signal light is not irradiated and the thermal lens is not formed, and the first thermal lens forming element also realizing a state, in which the light source light is emergent by a larger open angle than the usual open angle in the case where the first signal light is irradiated and the thermal lens is formed, corresponding to whether or not the first signal light is irradiated, and a first light source light selecting portion in which the first light source light, which is emergent from the first thermal lens forming element by the usual open angle, is outputted from a first output port, the first light source light, which is emergent from the first thermal lens forming element by an open angle larger than the usual open angle, is outputted from a second output port; the second optical switch comprising, a second signal input portion in which light source light of the second wave-length $\lambda 2$ outputted from the second output port of the first optical switch is taken in as a second signal light and then this second signal light and the second light source light, which is continuous light having the first wave-length $\lambda 1$, are incident being concentrically converged, a second thermal lens forming element in which a thermal lens is used, the thermal lens having a second light absorbing layer having a wave-length band exhibiting an absorbing property with respect to the second signal light and also exhibiting a transmission property with respect to the second light source light, the thermal lens being based on a distribution of an index of refraction reversibly generated by a temperature rise in a region of the second light absorbing layer which absorbs the second signal light and by a temperature rise in its peripheral region, the second thermal lens forming element realizing a state, in which the second light source light is emergent by a usual open angle in the case where the second signal light is not irradiated and the thermal lens is not formed, and the second thermal lens forming element also realizing a state, in which the second light source light is emergent by a larger open angle than the usual open angle in the case where the second signal light is irradiated and the thermal lens is formed, corresponding to whether or not the second signal light is irradiated, and a second light source light selecting portion in which the second light source light, which is emergent by the usual open angle, is outputted from a first output port, and the second light source light, which is emergent by an open angle larger than the usual open angle, is outputted from a second output port; the feedback portion making the second light source light outputted from a second output port of a second optical switch as feedback light and inputting feedback light into the first optical switch as the first signal light following a first signal optical pulse; and wherein, when a first signal optical pulse for setting is inputted, the switch is turned on, this ON state is maintained by the feedback light, when the first signal optical pulse for resetting is inputted into the first optical switch, the first light source light, the open angle of which is larger than the usual open angle, is formed in the first thermal lens forming element, and an output from the second output port of the first light source light is shut off and the switch is turned off.

According to the present invention, in the above first invention, the first light source light selecting portion and the second light source light selecting portion are respectively a mirror having a hole, when the open angle is a usual open angle, the first light source light and the second light source light respectively pass in the hole, when the open angle is larger than the usual angle, directions of the optical passages of the first light source light and the second light source light are changed by the mirror portions of the mirrors having a hole.

DETAILED DESCRIPTION OF PREFERRED EMBODIMENTS

The present invention has the above characteristics. Embodiments of the present invention will be explained below.

Figure 1:
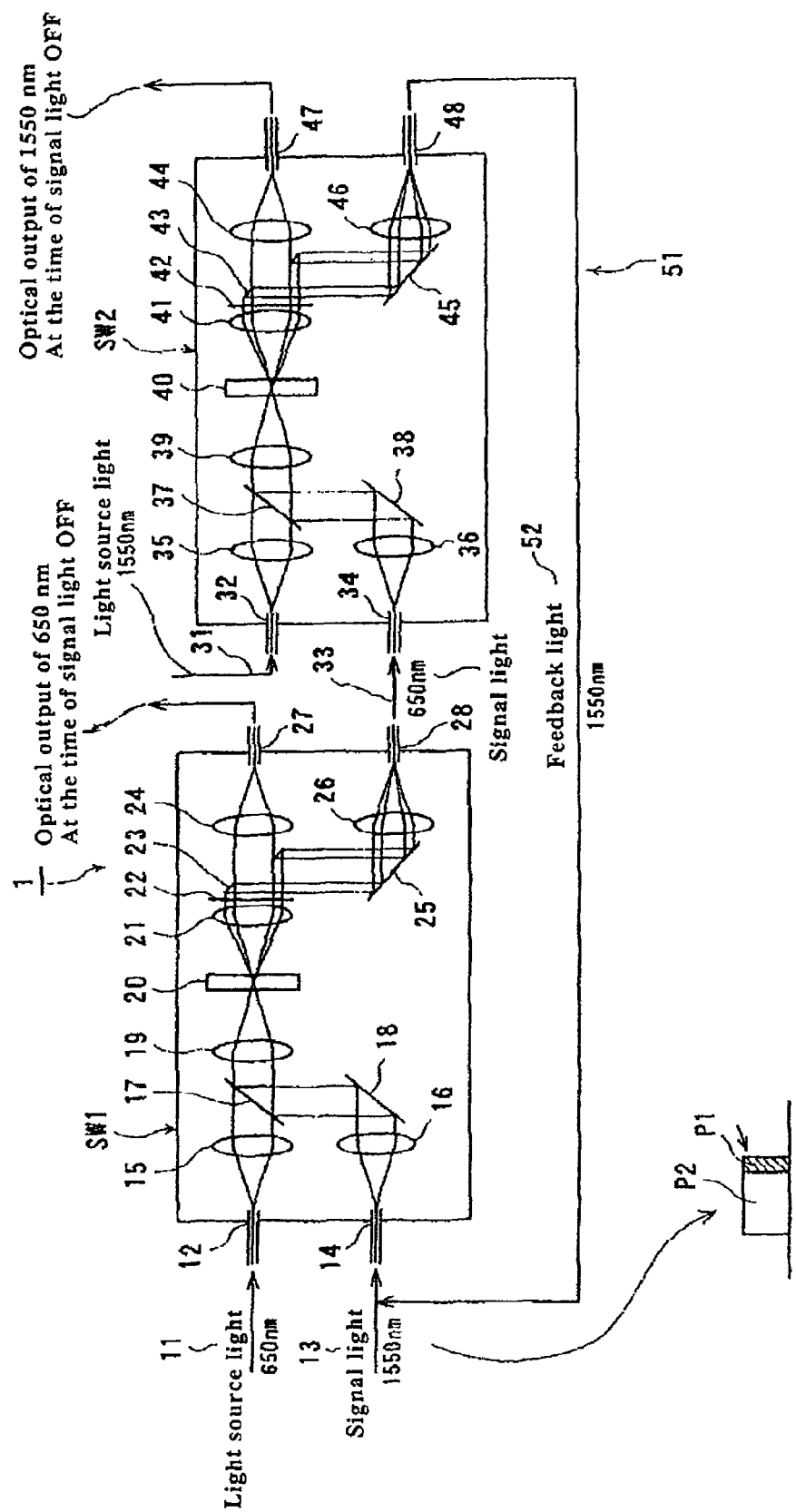
FIG. 1 is a schematic illustration showing a structure of an optical flip-flop circuit of an embodiment of the present invention.

FIG. 1 is a schematic illustration showing a structure of an optical flip-flop circuit of an embodiment of the present invention.

In this optical flip-flop circuit (1), a first switch (SW1) and a second switch (SW2) are arranged in series to each other.

The first switch (SW1) includes: an input port (12) for taking in light source light (11) which is continuous light (CW), the wave-length of which is 650 nm; and an input port (14) for taking in pulse-shaped signal light (gate light) (13), the wave-length of which is 1550 nm. On the downstream side of the input port (12), a lens (15) is arranged which makes light source light (11), which has been incident, to be parallel light. On the downstream side of the input port (14), a lens (16) is arranged which makes signal light (13), which has been incident, to be parallel light. On the downstream side of the lens (15), a dichroic mirror (17) is arranged. On the downstream side of the lens (16), a mirror (18), which changes an optical passage of parallel light sent from the lens (16), is arranged. The dichroic mirror (17) transmits parallel light sent from the lens (15) and changes an optical passage of parallel light sent from the mirror (18). Therefore, light source light (11) and signal light (13) are concentrically overlapped on each other and formed into parallel light. On the downstream side of the dichroic mirror (17), the following components are arranged in this order. The components are a lens (19), a thermal lens forming element (20), a lens (21), a filter (22), a mirror (23) having a hole, and a lens (24). The lens (19) converges overlapped parallel light, which is sent from the dichroic mirror (17), so that a focus of the convergence can be located in a thermal lens forming element (20). In the case where only light source light (11) is incident upon the thermal lens forming element (20), light source light (11) is emergent from the thermal lens forming element (20) by a usual open angle. In the case where both light source light (11) and signal light (13) are simultaneously incident upon the thermal lens forming element (20), a thermal lens is formed, and both rays of light (11), (13) are emergent from the thermal lens forming element (20) by an open angle larger than the usual open angle. Concerning the thermal lens forming element (20), when a signal light pulse for further resetting is incident upon the thermal lens forming element (20) from a second input port (14) under the condition that the thermal lens has been formed, a pulse intensity of the entire signal light exceeds a threshold value and the thermal lens is disturbed. Accordingly, open angles of both rays of light (11), (13) are made larger than a proper open angle. The lens (21) makes both rays of light (11), (13), which are emergent from the thermal lens forming element (20), to be parallel light. The filter (22) cuts signal light (13) and makes light source light (11) pass through. The mirror (23) having a hole makes light source light (11), the open angle of which is usual, pass through the hole and reflects light source light (11), the open angle of which is larger than the usual open angle, on its mirror portion so as to change the optical passage. The mirror (24) arranged on the downstream side of the mirror (23) having a hole converges light source light (11) which has passed through the hole of the mirror (23) having a hole. In FIG. 1, under the mirror (23) having a hole, a mirror (25) is arranged which further reflects light source light (11) reflected on the mirror (23) having a hole so as to change an optical passage. On the downstream side of the mirror (25), a lens (26) for converging parallel light sent from the mirror (25) is arranged. The first switch (SW1) includes two output ports (27), (28). At the time of turning off signal light (13), the output port (27) outputs light of 650 nm which has been converged by the lens (24). At the time of turning on signal light (13), the output port (28) outputs light of 650 nm which has been converged by lens (26).

The second switch (SW2) includes: an input port (32) for taking in light source light (31) which is continuous light (CW), the wave-length of which is 1550 nm; and an input port (34) for taking in pulse-shaped signal light (gate light) (33), the wave-length of which is 650 nm. On the downstream side of the input port (32), a lens (35) is arranged which makes light source light (31), which has been incident, to be parallel light. On the downstream side of the input port (34), a lens (36) is arranged which makes signal light (33), which has been incident, to be parallel light. On the downstream side of the lens (35), a dichroic mirror (37) is arranged. On the downstream side of the lens (36), a mirror (38), which changes an optical passage of parallel light sent from the lens (36), is arranged. The dichroic mirror (37) transmits parallel light sent from the lens (35) and changes an optical passage of parallel light sent from the mirror (38). Therefore, light source light (31) and signal light (33) are concentrically overlapped on each other and formed into parallel light. On the downstream side of the dichroic mirror (37), the following components are arranged in this order. The components are a lens (39), a thermal lens forming element (40), a lens (41), a filter (42), a mirror (43) having a hole, and a lens (44). The lens (39) converges overlapped parallel light, which is sent from the dichroic mirror (37), so that a focus of the convergence can be located in the thermal lens forming element (40). In the case where only light source light (31) is incident upon the thermal lens forming element (40), light source light (31) is emergent from the thermal lens forming element (40) by a usual open angle. In the case where both light source light (31) and signal light (33) are simultaneously incident upon the thermal lens forming element (40), a thermal lens is formed, and both rays of light (31), (33) are emergent from the thermal lens forming element (40) by an open angle larger than the usual open angle. The lens (41) makes both rays of light (31), (33), which are emergent from the thermal lens forming element (40), to be parallel light. The filter (42) cuts signal light (33) and makes light source light (31) pass through. The mirror (43) having a hole makes light source light (31), the open angle of which is usual, pass through the hole and reflects light source light (31), the open angle of which is larger than the usual open angle, on its mirror portion so as to change the optical passage. The mirror (44) arranged on the downstream side of the mirror (43) having a hole converges light source light (31) which has passed through the hole of the mirror (43) having a hole. In FIG. 1, under the mirror (43) having a hole, a mirror (45) is arranged which further reflects light source light (31) reflected on the mirror (43) having a hole so as to change an optical passage. On the downstream side of the mirror (45), a lens (46) for converging parallel light sent from the mirror (45) is arranged. The second switch (SW2) includes two output ports (47), (48). At the time of turning off signal light (33), the output port (47) outputs light of 1550 nm which has been converged by the lens (44). At the time of turning on signal light (33), the output port (48) outputs light of 1550 nm which has been converged by the lens (46).

In the optical flip-flop (1) of this embodiment, a feedback portion (51) is arranged which connects the output port (48) of the second switch (SW2) with the input port (14) of the first switch (SW1). As illustrated in the left lower portion of FIG. 1, this feedback portion (51) operates as follows. While following the pulse P1 of wave-length 1550 nm inputted into the input port (14) of the first switch (SW1), feedback light (52) of wave-length 1550 nm outputted from the second switch (SW2) is inputted into the input port (14) of the first switch (SW1), so that ON-state of the optical flip-flop (1) can be maintained. It is possible to set the pulse width of the pulse P1 at 0.5 ms to 1 ms. It is also possible to set the pulse height (intensity) of the pulse P1 at several mW to 10 mW. However, the pulse width of the pulse P1 and the pulse height (intensity) of the pulse P1 are not necessarily limited to the above specific values. The pulse width can be determined corresponding to the response time of the system composing the first switch (SW1) and the second switch (SW2). The pulse width of the pulse P2 is made to correspond to a period of time in which ON-state is maintained. The pulse height may be made to be the same as the of the pulse P2. Alternatively, the pulse height may be made to be different from that of the pulse P2.

Explanations will be made into the thermal lens forming element (20) of the first switch (SW1) and thermal lens forming element (40) of the second switch (SW2).

Figure 2:
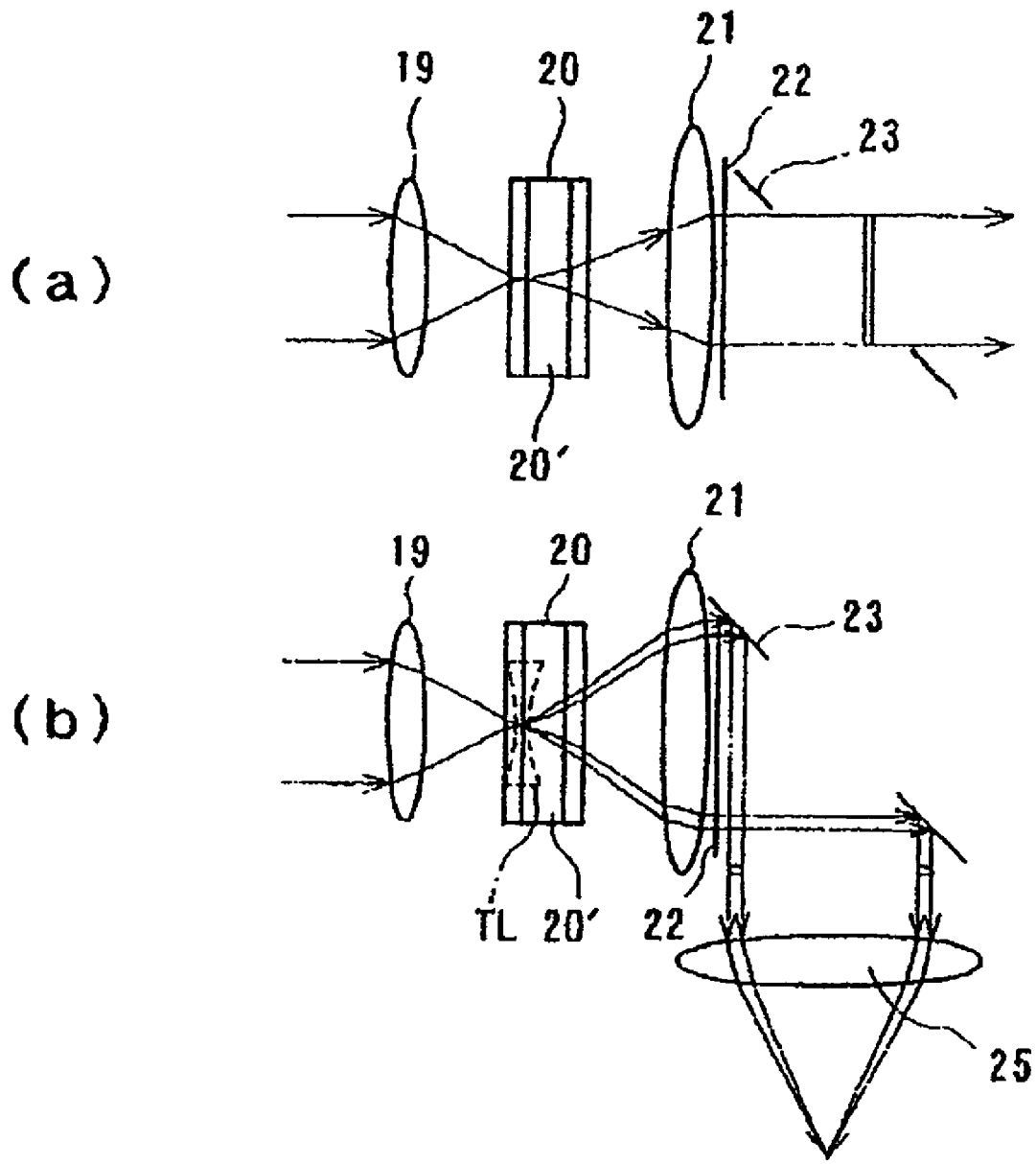
FIGS. 2A and 2B are conceptual views for explaining a thermal lens forming element.

FIGS. 2A and 2B are conceptual views for explaining the thermal lens forming element (20). The thermal lens forming element (20) includes a light absorbing layer (20') made of a pigment having a wave-length band which exhibits a transmission property with respect to light source light (11) of wave-length 650 nm and also exhibits an absorbing property with respect to signal light (13) of wave-length 1550 nm as shown by the solid line in FIG. 3. A preferable example of the pigment having the above wave-length band is an infrared ray absorbing pigment obtained in the market. More specifically, it is possible to use CIR-960 manufactured by Nippon Carlit Co., Ltd.

In the thermal lens forming element (20), the following reversible change in the index of refraction is generated. In the thermal lens forming element (20), when the light absorbing layer (20') having the above wave-length band is irradiated with signal light (13) of wave-length 1550 nm, the thermal lens forming element (20) absorbs light. Therefore, a temperature of a region in which light is absorbed is raised and a temperature of its peripheral region is raised. Therefore, the index of refraction is changed. Accordingly, the index of refraction is changed corresponding to its temperature distribution, so that a thermal lens (TL) can be composed. After the irradiation of signal light (13) has been completed, the thermal lens forming element (20) is returned to its initial state. Consequently, in the case where the thermal lens forming element (20) is irradiated only with light source light (11), which is continuous light (CW), and signal light (13) is turned off, the thermal lens (TL) is not formed as shown in FIG. 2A. Therefore, light source light (11) is emergent from the thermal lens forming element (20) by a usual open angle and made to be parallel light by the lens (21) and passes through a hole of the mirror (22) having the hole as a beam, the cross-section of which is circular. On the other hand, in the case where the thermal lens forming element (20) is irradiated with light source light (11) and further signal light (13) is turned on, the thermal lens (TL) is formed as shown in FIG. 2B. Therefore, light source light (11) is emergent from the thermal lens forming element (20) by an open angle larger than the usual open angle and made to be parallel light by the lens (21). Accordingly, a beam, the cross-section of which is a ring-shape, is formed and a portion of the beam is reflected by the mirror portion of the mirror (23) having the hole, so that a direction of the optical passage can be changed.

Figure 3:
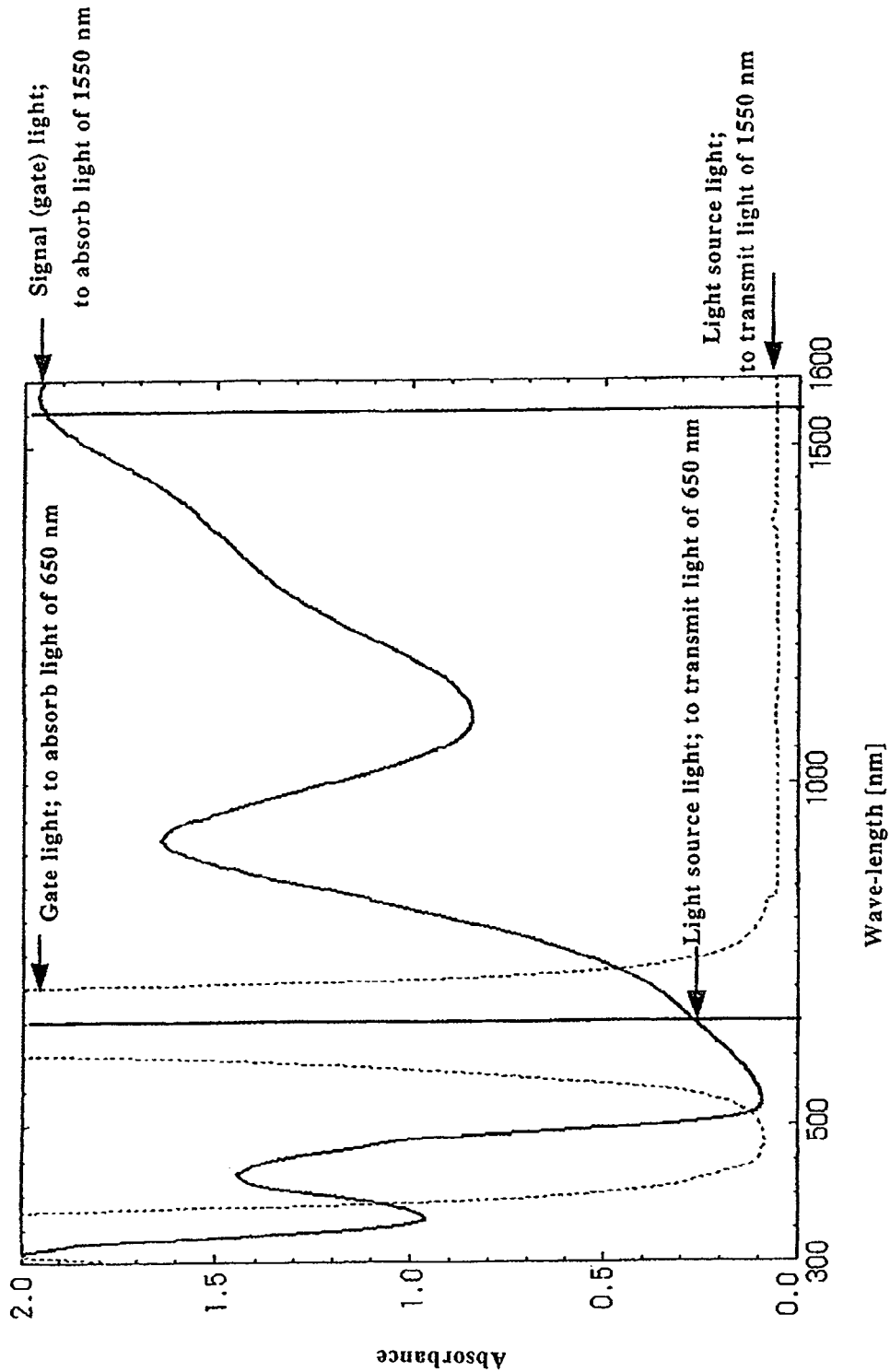
FIG. 3 is a schematic illustration for explaining a wavelength characteristic of a light absorbing layer used for a thermal lens forming element.

On the other hand, the thermal lens forming element (40) includes a light absorbing layer made of a pigment having a wave-length band which exhibits a transmission property with respect to light source light (31) of wave-length 1550 nm and also exhibits an absorbing property with respect to signal light (33) of wave-length 650 nm as shown by the chain line in FIG. 3. A preferable example of the pigment having the above wave-length band is a soluble phthalocyanine pigment. More particularly, it is possible to use copper (II) 2,9,16,23-tetra-tert-butyl-29H,31H-phthalocyanine. The formation and action of the thermal lens are the same as those described before.

Basically, it is sufficient that the thermal lens forming element (20), (40) has the light absorbing film (20'), (40') having the above wave-length characteristic of absorption and transmission of light, wherein it is possible for the light absorbing layer (20'), (40') to form a thermal lens. As described in the official gazette of JP-A-2005-265986 filed by the present inventors, it is possible to adopt various structures including a layer that facilitates absorption of light, a heat transfer layer and a heat insulation layer.

Next, an action of the optical flip-flop circuit (1) relating to the embodiment of the present invention will be explained below.

First of all, explanations will be made into a case in which optical flip-flop circuit (1) is changed from a state of OFF to a state of ON. When the optical flip-flop circuit (1) is in the state of OFF, signal light (13) is not incident upon the first switch (SW1) and only light source light (11), which is continuous light, is incident upon the first switch (SW1) from the input port (12) and made to be parallel light by the lens (15). Then, the parallel light passes through the dichroic mirror (17) and is converged by the lens (19) and focused on the thermal lens forming element (20). At this time, a thermal lens is not formed in the thermal lens forming element (20). Therefore, light source light (11) is emergent from the thermal lens forming element (20) by a usual open angle and made to be parallel light by the lens (21). Then, the parallel light passes through the filter (22) and also passes through a hole of the mirror (23) having a hole and is converged by the lens (24) and outputted from the output port (27) as an optical output of light of 650 nm.

At this time, in the second switch (SW2), signal light (33) is not incident upon the input port (34). Only light source light (31), which is continuous light, is incident upon the input port (32) and made to be parallel light by the lens (35). The parallel light passes through the dichroic mirror (37) and is converged by the lens (39) and focused on the thermal lens forming element (24). At this time, a thermal lens is not formed in the thermal lens forming element (40). Therefore, light source light (31) is emergent from the thermal lens forming element (40) by a usual open angle and made to be parallel light by the lens (41). Then, the parallel light passes through the filter (42) and also passes through a hole of the mirror (43) having the hole and is converged by the lens (44) and outputted from the output port (47) as an optical output of light of 1550 nm.

When pulse-shaped signal light (13) for setting, which is the pulse P1 shown in the left lower portion of FIG. 1, is inputted under the condition that the optical flip-flop circuit (1) is in the state of OFF described before, the switch is turned on at the forward edge portion (shown by the arrow in FIG. 1) of the pulse.

That is, when a pulse of signal light (13) for setting is incident from the input port (14), the pulse is made to be parallel light by the lens (16) and its optical passage is changed by the mirror (18). Accordingly, the parallel light reaches the dichroic mirror (17). On the other hand, from the input port (12), light source light (11), which is continuous light, is incident and made to be parallel light by the lens (15). This parallel light reaches the dichroic mirror (17). By this dichroic mirror (17), light source light (11) and signal light (13) are concentrically overlapped on each other and made to be parallel light. This parallel light is converged by the lens (19) and focused on the thermal lens forming element (20). At this time, the light absorbing layer of thermal lens forming element (20) exhibits an absorbing property with respect to signal light (13), the wave-length of which is 1550 nm. Therefore, a thermal lens is formed. Due to the foregoing, light source light (11) and signal light (13) are emergent by an open angle larger than the usual open angle and made to be parallel light by the lens (21). Signal light (13) is cut with the filter (22). Light source light (11) is reflected by the mirror portion of the mirror (23) having a hole. Therefore, the optical passage is changed and further light is reflected by the mirror (25). Accordingly, the optical passage is changed again and the parallel light is converged by the lens (26) and outputted from the output port (28) as an optical output of light of 650 nm.

This optical output of 650 nm is inputted into the input port (34) of second switch (SW2) as signal light (33) and made to be parallel light by the lens (36). Then the optical passage of the parallel light is changed by the mirror (38). After that the light reaches the dichroic mirror (37). On the other hand, from the input port (32), light source light (31), which is continuous light, the wave-length of which is 1550 nm, is incident and made to be parallel light by the lens (35) and reaches the dichroic mirror (37). By this dichroic mirror (37), light source light (31) and signal light (33) are concentrically overlapped on each other and made to be parallel light and converged by the lens (39) and focused on the thermal lens forming element (40). Since a light absorbing layer of the thermal lens forming element (40) exhibits an absorbing property with respect to signal light (33), the wave-length of which is 650 nm, at this time, a thermal lens is formed. Due to the foregoing, light source light (31) and signal light (33) are emergent by an open angle larger than the usual open angle and made to be parallel light by the lens (41). Signal light (33) is cut by the filter (42) and light source light (31) is reflected by a mirror portion of the mirror (43) having a hole so that the optical passage can be changed. Then, the light is further reflected by the mirror (45) and the optical passage is changed again. After that, the light is converged by the lens (46) and outputted from the output port (48) as an optical output of light of 1550 nm. This optical output of 1550 nm becomes feedback light (52) and is sent to the input port (14) of the first switch (SW1) by the feedback portion (51). Therefore, this feedback light follows the pulse P1 as the pulse P2 shown in the left lower portion of FIG. 1. In this way, the state of ON, which has been set by the pulse P1, can be maintained.

Next, explanations will be made into a case in which the optical flip-flop circuit (1) is changed from ON to OFF. In the case where optical flip-flop circuit (1) is ON, the pulse P2 of the above feedback light (52) is maintained in the state of ON. When a pulse of additional signal light (13) for resetting is incident upon the input port (14) at this time, an intensity of signal light (13) is a sum of the intensity of feedback and the intensity of reset. Therefore, the intensity of signal light (13) exceeds a threshold value. Then, a thermal lens formed in the thermal lens forming element (20) is disturbed. Therefore, the open angle is further extended and the light can not be reflected by the mirror portion of the mirror (23) having a hole. Due to the foregoing, an output from the output port (28) is stopped. Therefore, signal light (34) is not incident upon the second switch (SW2). Accordingly, the thermal lens can not be formed in the thermal lens forming element (40). Then, in the first switch (SW1), an optical output of light of 650 nm is outputted from the output port (27). In the second switch (SW2), an optical output of 1550 nm is not outputted from the output port (48). An output of 1550 nm is outputted from the output port (47). This state is maintained and the optical flip-flop circuit (1) is put into the state of OFF.

Whether the optical flip-flop circuit (1) is in the state of ON or OFF can be known by detecting at least one of the output of output port (27) of the first switch (SW1) and the output of output port (47) of the second switch (SW2).

An embodiment of the optical flip-flop circuit related to the present invention is explained as above. However, it should be noted that the present invention is not limited to the above specific embodiment. Variations may be made without departing from the scope of claim of the present invention.

For example, in the above embodiment, in the first switch (SW1), light source light (11), the wave-length of which is 650 nm, and signal light (13), the wave-length of which 1550 nm, are used. In the second switch (SW2), light source light (31), the wave-length of which is 1550 nm, and signal light (33), the wave-length of which 650 nm, are used. However, a relation between the wave-length of light of the first switch (SW1) and the wave-length of light of the second switch (SW2) may be reversed.

In the above embodiment, the wave-lengths of 650 nm and 1550 nm are utilized, however, it should be noted that the invention is not limited to the above specific wave-lengths. As long as the thermal lens can be formed, a pair of arbitrary wave-lengths can be utilized.

In the above embodiment, an optical output of the second output port (48) is made to be feedback light (52) as it is. However, only a portion of the optical output of the second output port (48) may be utilized.

In the above embodiment, the mirror having a hole is used for the light source selecting portion. However, it should be noted that the present invention is not limited to the above specific embodiment. As long as it is possible to select light source light, for example, when the hole portion is made of transparent material, it can be used for the light source selecting portion.

What is claimed is:

1. An optical flip-flop circuit comprising:

a first optical switch, a second optical switch and a feedback portion;

the first optical switch comprising, a first signal input portion upon which a ray of first signal light, the shape of which is pulse-shaped, having a first wave-length $\lambda 1$, and a ray of first light source light, which is continuous light, having a second wave-length $\lambda 2$, are incident being concentrically converged;

a first thermal lens forming element in which a thermal lens is used, the thermal lens having a first light absorbing layer having a wave-length band exhibiting an absorbing property with respect to the first signal light and also exhibiting a transmission property with respect to the first light source light, the thermal lens being based on a distribution of an index of refraction reversibly generated by a temperature rise in a region of the first light absorbing layer which absorbs the first signal light and by a temperature rise in its peripheral region, the first thermal lens forming element realizing a state, in which the light source light is emergent by a usual open angle in the case where the first signal light is not irradiated and the thermal lens is not formed, and the first thermal lens forming element also realizing a state, in which the light source light is emergent by a larger open angle than the usual open angle in the case where the first signal light is irradiated and the thermal lens is formed, corresponding to whether or not the first signal light is irradiated, and a first light source light selecting portion in which the first light source light, which is emergent from the first thermal lens forming element by the usual open angle, is outputted from a first output port, the first light source light, which is emergent from the first thermal lens forming element by an open angle larger than the usual open angle, is outputted from a second output port;

the second optical switch comprising, a second signal input portion in which light source light of the second wave-length $\lambda 2$ outputted from the second output port of the first optical switch is taken in as a second signal light and then this second signal light and the second light source light, which is continuous light having the first wave-length $\lambda 1$, are incident being concentrically converged, a second thermal lens forming element in which a thermal lens is used, the thermal lens having a second light absorbing layer having a wave-length band exhibiting an absorbing property with respect to the second signal light and also exhibiting a transmission property with respect to the second light source light, the thermal lens being based on a distribution of an index of refraction reversibly generated by a temperature rise in a region of the second light absorbing layer which absorbs the second signal light and by a temperature rise in its peripheral region, the second thermal lens forming element realizing a state, in which the second light source light is emergent by a usual open angle in the case where the second signal light is not irradiated and the thermal lens is not formed, and the second thermal lens forming element also realizing a state, in which the second light source light is emergent by a larger open angle than the usual open angle in the case where the second signal light is irradiated and the thermal lens is formed, corresponding to whether or not the second signal light is irradiated, and a second light source light selecting portion in which the second light source light, which is emergent by the usual open angle, is outputted from a first output port, and the second light source light, which is emergent by an open angle larger than the usual open angle, is outputted from a second output port;

the feedback portion making the second light source light outputted from a second output port of a second optical switch as feedback light and inputting feedback light into the first optical switch as the first signal light following a first signal optical pulse;

and wherein, when a first signal optical pulse for setting is inputted, the switch is turned on, this ON state is maintained by the feedback light, when the first signal optical pulse for resetting is inputted into the first optical switch, the first light source light, the open angle of which is larger than the usual open angle, is formed in the first thermal lens forming element, and an output from the second output port of the first light source light is shut off and the switch is turned off.

2. The optical flip-flop circuit of claim 1, wherein the first light source light selecting portion and the second light source light selecting portion are respectively a mirror having a hole, when the open angle is a usual open angle, the first light source light and the second light source light respectively pass in the hole, when the open angle is larger than the usual angle, directions of the optical passages of the first light source light and the second light source light are changed by the mirror portions of the mirrors having a hole.

* * * * *